(12) United States Patent
Takahashi et al.

(10) Patent No.: US 7,829,446 B2
(45) Date of Patent: Nov. 9, 2010

(54) METHOD FOR DIVIDING WAFER, METHOD FOR MANUFACTURING SILICON DEVICES, AND METHOD FOR MANUFACTURING LIQUID EJECTING HEADS

(75) Inventors: Wataru Takahashi, Chino (JP); Yoshinao Miyata, Matsukawa-machi (JP); Kazushige Umetsu, Chino (JP); Yutaka Yamazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 63 days.

(21) Appl. No.: 11/937,318

(22) Filed: Nov. 8, 2007

(65) Prior Publication Data

US 2008/0113459 A1     May 15, 2008

(30) Foreign Application Priority Data

Nov. 9, 2006   (JP) ............................. 2006-304586

(51) Int. Cl.
    *H01L 21/425* (2006.01)
(52) U.S. Cl. ............................ 438/524; 438/535; 438/3; 438/712; 257/E21.134; 257/E21.208; 257/E21.218; 257/E21.267; 257/E21.278; 257/E21.32; 257/E21.324; 257/E21.328; 257/E21.347; 257/E21.499; 257/E21.511
(58) Field of Classification Search ............. 438/3, 438/106, 311, 463, 524, 535, 712, 723, 743, 438/733; 257/E21.134, 208, 218, 267, 278, 257/32, 324, 328, 347, 499, 511
See application file for complete search history.

(56) References Cited

U.S. PATENT DOCUMENTS

| | | | | |
|---|---|---|---|---|
| 6,168,263 | B1 * | 1/2001 | Nojima et al. | ................. 347/54 |
| 2004/0002199 | A1 | 1/2004 | Fukuyo et al. | |
| 2004/0207697 | A1 * | 10/2004 | Conta | ........................... 347/71 |
| 2005/0130390 | A1 | 6/2005 | Andrews et al. | |
| 2005/0199592 | A1 * | 9/2005 | Iri et al. | ................... 219/121.6 |
| 2005/0272223 | A1 | 12/2005 | Fuji et al. | |
| 2006/0189100 | A1 * | 8/2006 | Ishizuka | ...................... 438/460 |
| 2006/0192299 | A1 * | 8/2006 | Hashimoto | .................. 257/782 |
| 2006/0220183 | A1 * | 10/2006 | Asai et al. | ................... 257/622 |
| 2007/0111477 | A1 * | 5/2007 | Maruyama et al. | .......... 438/460 |

(Continued)

FOREIGN PATENT DOCUMENTS

JP          05-254146          10/1993

(Continued)

OTHER PUBLICATIONS

U.S. Appl. No. 11/752,782, Mail Date Dec. 28, 2009, Office Action.

(Continued)

*Primary Examiner*—David Nhu
(74) *Attorney, Agent, or Firm*—Workman Nydegger

(57) ABSTRACT

A method for dividing a wafer into a plurality of chips is provided. The method includes providing recesses in a surface of the wafer at positions along boundaries between regions to become the individual chips, providing fragile portions having a predetermined width inside the wafer at positions along the boundaries by irradiation of the other surface of the wafer with a laser beam whose condensing point is placed inside the wafer, the fragile portions including connected portions at least at one of the surfaces of the wafer, and dividing the wafer at the fragile portions into the individual chips by applying an external force to the wafer.

9 Claims, 12 Drawing Sheets

U.S. PATENT DOCUMENTS

2007/0275542 A1  11/2007  Takahashi

FOREIGN PATENT DOCUMENTS

| JP | 09-193379 | 7/1997 |
| JP | 2002-192370 | 7/2002 |
| JP | 2002-313754 | 10/2002 |
| JP | 2005-086161 | 3/2005 |
| JP | 2005-166728 | 6/2005 |
| JP | 2005-271215 | 10/2005 |
| JP | 2006-024676 | 1/2006 |
| JP | 2006-108459 | 4/2006 |
| JP | 2006-245062 | 9/2006 |
| JP | 2006-302926 | 11/2006 |

OTHER PUBLICATIONS

U.S. Appl. No. 11/752,782, Mail Date Sep. 3, 2009, Final Office Action.

U.S. Appl. No. 11/752,782, Mail Date Feb. 2, 2009, Office Action.

U.S. Appl. No. 11/752,782, Mail Date Jun. 21, 2010, Final Office Action.

* cited by examiner

METHOD FOR DIVIDING WAFER, METHOD FOR MANUFACTURING SILICON DEVICES, AND METHOD FOR MANUFACTURING LIQUID EJECTING HEADS

The entire disclosure of Japanese Patent Application No. 2006-304586, filed Nov. 9, 2006 is expressly incorporated by reference herein.

BACKGROUND

1. Technical Field

The present invention relates to a method for dividing a wafer into a plurality of chips, and methods for manufacturing silicon devices and liquid ejecting heads using the method for dividing the wafer.

2. Related Art

A liquid ejecting head in which pressure generators such as piezoelectric elements apply pressure to liquid in pressure-generating chambers to eject liquid droplets from nozzle openings is known. A typical example of such a liquid ejecting head is an ink jet recording head that ejects ink droplets. An ink jet recording head that has a channel-forming substrate provided with pressure-generating chambers is known. The channel-forming substrate has pressure generators such as piezoelectric elements provided on one surface, and a nozzle plate having nozzle openings and bonded to the other surface.

Such a channel-forming substrate constituting an ink jet recording head is formed of, for example, a silicon single-crystal substrate. In general, in forming the channel-forming substrate, a plurality of channel-forming substrates are integrally formed in a wafer, such as a silicon wafer, and the wafer is divided into pieces.

JP-A-2002-313754 (pp 4-9, FIGS. 1 and 2) discloses a method for dividing a wafer, in which, for example, a break pattern consisting of a plurality of through-holes aligned at a predetermined interval is provided along a planned dividing line between channel-forming substrates (chips) in a silicon wafer. By applying an external force to the silicon wafer, the silicon wafer can be divided along the break pattern. In a method for manufacturing ink jet recording heads, when a silicon wafer is divided by applying this method, the silicon wafer is divided at fragile portions between the through-holes constituting the break pattern by receiving the external force. As a result, a plurality of channel-forming substrates (chips) can be obtained.

Thus, by providing a break pattern in a silicon wafer, the silicon wafer can be divided into a plurality of channel-forming substrates with relative ease.

However, because it is difficult to divide a silicon wafer (the fragile portions) constantly at a desired position and in a desired shape, the silicon wafer may be divided at a portion other than the fragile portions between the through-holes. Further, the channel-forming substrates as finished products can have cracks originating at corners of the through-holes.

In particular, in the case of manufacturing liquid ejecting heads such as ink jet recording heads, there is a problem in that the fracture surface may produce fine dust, depending on the breakage condition, and the dust may adhere to the inside of the channel, thereby clogging the nozzles or the like. There is another problem in that, in the case of forming a thin film or the like on the channel-forming substrate, the dust may adhere to the surface thereof. This prevents proper formation of the film, and degrades the yield.

Further, in the case of providing fragile portions by irradiation with a laser beam, components provided on the wafer may block the laser beam. To avoid this, the components need to be provided at positions distant from regions to become the fragile portions. This decreases the number of silicon devices obtainable from a wafer and leads to a high manufacturing cost.

In particular, in the case of providing fragile portions in a thick wafer by irradiation with a laser beam, components on the wafer need to be provided at positions distant from the fragile portions, whereby the number of silicon devices obtainable from a wafer is further decreased.

Further, in the case of providing fragile portions in the thickness direction of a wafer by irradiation with a laser beam, processing time becomes long.

In the case of providing fragile portions in a thin wafer, the rigidity of the wafer decreases. This may lead to breakages and cracks, whereby handling of the wafer becomes troublesome.

SUMMARY

An advantage of some aspects of the invention is that it provides a method for dividing a wafer in which the wafer can be divided into a plurality of chips in a preferable condition while preventing breakages of chips and adherence of dust to the chips to increase the number of chips obtainable from a wafer and reduce the manufacturing cost, a method for manufacturing silicon devices and a method for manufacturing liquid ejecting heads.

According to an aspect of the invention, a method for dividing a wafer into a plurality of chips is provided. The method includes providing recesses in a surface of the wafer at positions along boundaries between regions to become the individual chips, providing fragile portions having a predetermined width inside the wafer at positions along the boundaries by irradiation of the other surface of the wafer with a laser beam whose condensing point is placed inside the wafer, the fragile portions including connected portions at least at one of the surfaces of the wafer, and dividing the wafer at the fragile portions into the individual chips by applying an external force to the wafer.

According to this aspect, the wafer can be divided at the fragile portions easily and in a preferable condition. Further, it is possible to prevent cracks or the like being produced in the chips as finished products in dividing the wafer. The provision of the recesses in the wafer reduces processing depth of the laser beam. This enables a stable laser processing and a reduction in processing time, leading to a reduction in manufacturing cost.

It is preferable that the recesses be provided by performing etching on the wafer. This enables the recesses to be provided quickly and accurately.

It is preferable that the other surface of the wafer be mirror-finished before being irradiated with the laser beam. This prevents the laser beam from being diffused because of foreign matters adhered to the surface of the substrate or fine irregularities in the wafer. Accordingly, the fragile portions can be easily provided at predetermined positions inside the wafer.

It is preferable that the fragile portions be provided so that a thickness of the connected portions is 30 μm or smaller. By setting the thickness of the connected portions to be relatively small, the substrate can be divided further easily and in a preferable condition.

It is preferable that a width of the fragile portions be 15 μm or smaller. By setting the width of the fragile portions to be relatively small, fracture surfaces can be more assuredly smoothed.

It is preferable that the fragile portions be provided by scanning the laser beam a plurality of times along the boundaries, the condensing point of the laser beam being differentiated in a thickness direction of the substrate. This enables the fragile portions to be provided with a relatively small width and in a preferable condition. Further, this prevents the fragile portions from affecting adversely the surrounding wafers.

According to another aspect of the invention, a method for manufacturing silicon devices is provided. In the method, a silicon wafer as the wafer is divided into a plurality of silicon devices using the method for dividing a wafer according to the above-described aspect. According to this aspect, the silicon wafer can be divided at the fragile portions easily and in a preferable condition. Further, it is possible to prevent cracks or the like being produced in the silicon devices as finished products in dividing the silicon wafer. The provision of the recesses in the silicon wafer reduces processing depth of the laser beam. This enables a stable laser processing and a reduction in processing time, leading to a reduction in manufacturing cost.

It is preferable that components are formed on a surface of the silicon wafer before being irradiated with the laser beam thereon. The provision of the recesses in the silicon wafer reduces processing depth of the laser beam and prevents the components from blocking the laser beam. This allows the components to be provided near the boundaries. This increases the number of silicon devices obtainable from a wafer and reduces the manufacturing cost.

It is preferable that a groove is provided near boundaries between regions to become individual silicon devices in the surface of the silicon wafer to be bonded to the components before the components are bonded to the surface of the silicon wafer with an adhesive. The groove guides the adhesive used for bonding the components and the surface of the silicon wafer thereinto and prevents the adhesive from flowing towards the boundaries and blocking the laser beam.

According to another aspect of the invention, a method for manufacturing liquid ejecting heads is provided. The method includes bonding a bonding surface of a wafer for forming channel-forming substrates and a bonding surface of a wafer for forming protective substrates, the wafer for forming channel-forming substrates having a plurality of channel-forming substrates integrally formed therein, each of the channel-forming substrates having pressure-generating chambers communicating with nozzle openings that eject liquid and pressure generators that generate pressure in the pressure-generating chambers, the wafer for forming protective substrates having a plurality of protective substrates integrally formed therein corresponding to the channel-forming substrates; providing recesses in a surface of the wafer for forming channel-forming substrates opposite the bonding surface thereof at positions along boundaries between regions to become individual channel-forming substrates; providing fragile portions having a predetermined width inside the wafer for forming protective substrates by irradiation with a laser beam from a surface opposite the bonding surface thereof, a condensing point of the laser beam being placed inside the wafer for forming protective substrates at positions along the boundaries, the fragile portions including connected portions at least at one of the bonding surface and the surface opposite the bonding surface of the wafer for forming protective substrates; and dividing the wafer for forming channel-forming substrates and the wafer for forming protective substrates at the fragile portions into a plurality of liquid ejecting heads by applying an external force to the wafers.

According to this aspect, the wafer for forming channel-forming substrates can be divided at the fragile portions easily and in a preferable condition. Further, it is possible to prevent cracks or the like being produced in the liquid ejecting heads as finished products in dividing the wafer for forming channel-forming substrates. The provision of the recesses in the wafer for forming channel-forming substrates reduces processing depth of the laser beam. This enables a stable laser processing and a reduction in processing time, leading to a reduction in manufacturing cost.

It is preferable that the pressure-generating chambers and the recesses be simultaneously provided by performing etching on the wafer for forming channel-forming substrates. This simplifies the manufacturing process and further reduces the manufacturing cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described.

First Embodiment

Figure 1:
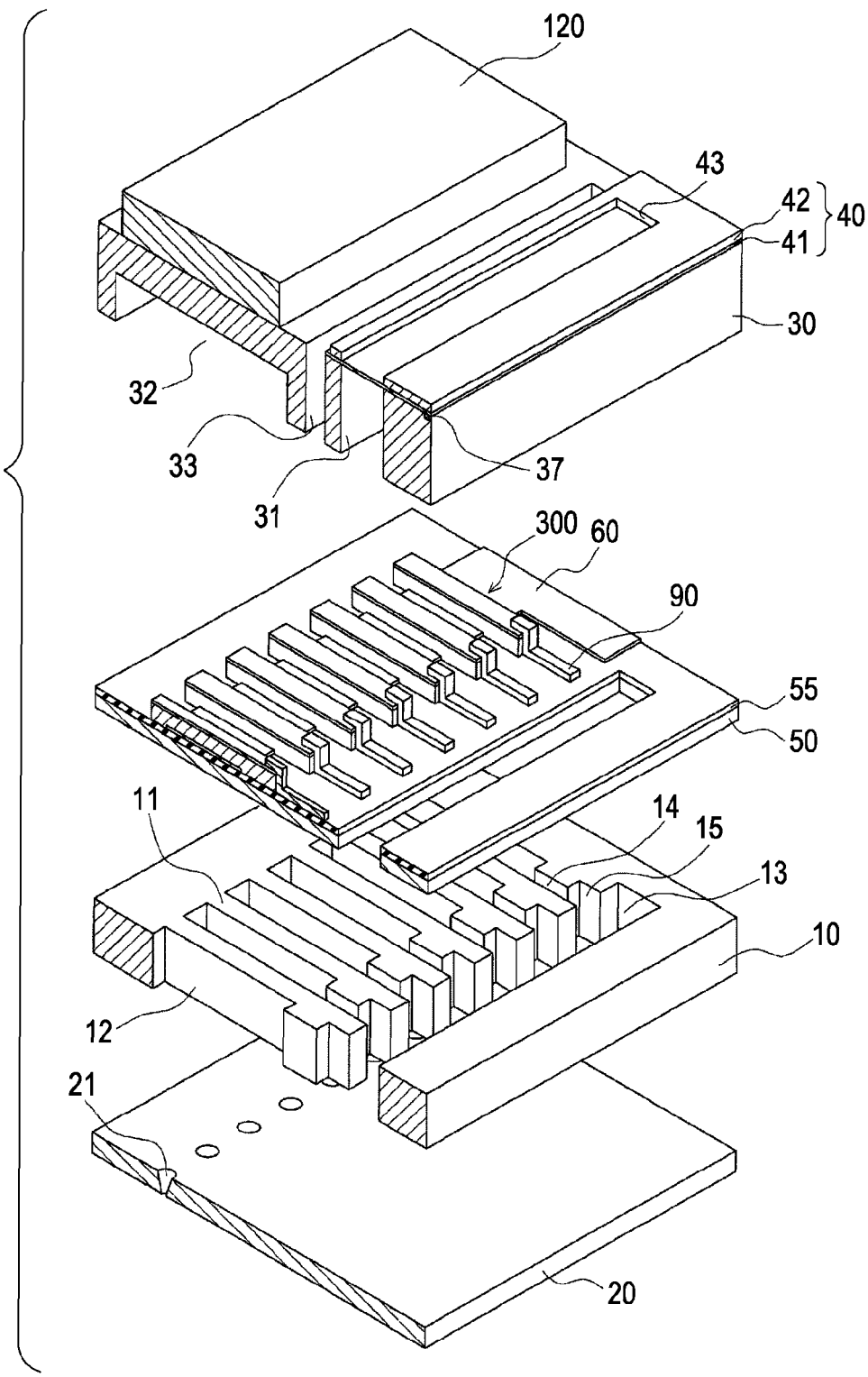
FIG. 1 is an exploded perspective view of an ink jet recording head.
Figure 2A:
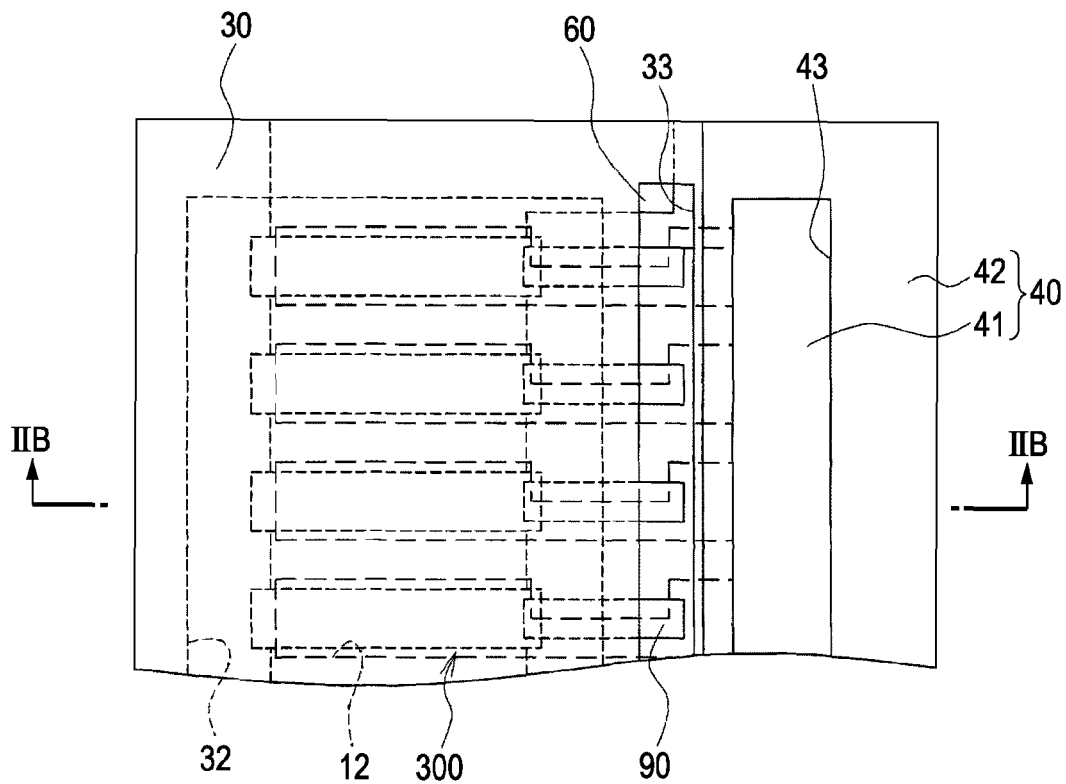
FIG. 2A is a plan view of the ink jet recording head.
Figure 2B:
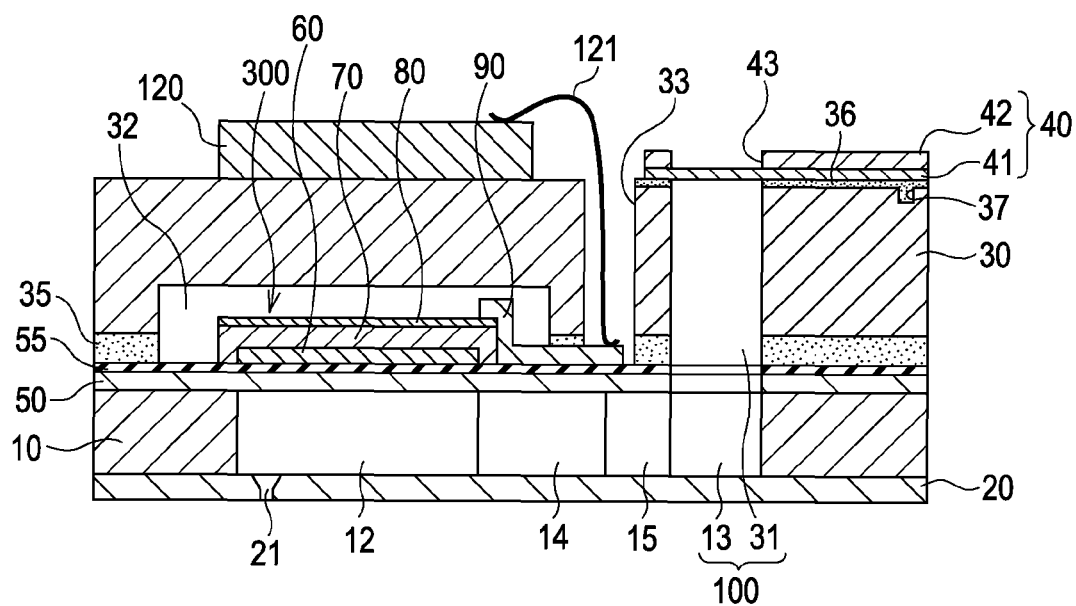
FIG. 2B is a cross-sectional view of the ink jet recording head.

FIG. 1 is a schematic exploded perspective view of an ink jet recording head as an example of a liquid ejecting head according to a first embodiment of the invention, and FIGS. 2A and 2B are a plan view of a channel-forming substrate and a sectional view of the same taken along line IIB-IIB.

As shown in the drawings, a channel-forming substrate 10 according to the embodiment is made of a silicon single-crystal substrate having a (110) crystal plane orientation in the thickness direction. An elastic film 50 consisting of silicon dioxide and having a thickness of 0.5 μm to 2 μm is preliminarily provided on a surface of the channel-forming substrate 10 by thermal oxidation.

The channel-forming substrate 10 has pressure-generating chambers 12 arranged parallel to each other in the width direction (lateral direction) of the channel-forming substrate 10. The pressure-generating chambers 12 are defined by a plurality of partitions 11 that are formed by performing anisotropic etching on the other surface of the channel-forming substrate 10. Each of the partitions 11 further defines an ink supply channel 14 and a communicating channel 15 at an end in the longitudinal direction of a corresponding one of the pressure-generating chambers 12 of the channel-forming substrate 10. A communicating region 13 constituting a part of a reservoir 100 that serves as a common ink chamber (liquid chamber) of the pressure-generating chambers 12 is provided on an end of the communicating channels 15. In short, the channel-forming substrate 10 has liquid channels each including the pressure-generating chamber 12, the communicating region 13, the ink supply channel 14, and the communicating channel 15.

The ink supply channel 14 communicates with an end in the longitudinal direction of the corresponding pressure-generating chamber 12 and has a cross-section smaller than that of the pressure-generating chamber 12. In the embodiment, for example, the width of the ink supply channel 14 provided near the pressure-generating chamber 12 is made smaller than that of the pressure-generating chamber 12 by reducing the width of the liquid channel extending between the reservoir 100 and the pressure-generating chamber 12. Although the ink supply channel 14 is provided by reducing the width of the liquid channel from one side in the embodiment, the ink supply channel 14 may be provided by reducing the width of the liquid channel from two sides. Alternatively, the ink supply channel 14 may be provided by reducing the thickness, not the width, of the liquid channel. The communicating channel 15 communicates with an end of the corresponding ink supply channel 14 opposite the end communicating with the pressure-generating chamber 12. The communicating channel 15 has a cross-section larger than that of the ink supply channel 14. In the embodiment, the communicating channel 15 and the pressure-generating chamber 12 have equivalent cross-sections.

In short, the channel-forming substrate 10 has the pressure-generating chambers 12, the ink supply channels 14 having a lateral cross-section smaller than that of the pressure-generating chambers 12, and the communicating channels 15 communicating with the ink supply channels 14 and having a lateral cross-section larger than that of the ink supply channels 14, all of which being defined by the partitions 11.

A nozzle plate 20 has nozzle openings 21 bored therein, each of which communicates with the vicinity of an end of the corresponding pressure-generating chamber 12 opposite the end communicating with the ink supply channel 14. The nozzle plate 20 is bonded to an open surface of the channel-forming substrate 10 with an adhesive, a heat welding film, or the like. The nozzle plate 20 is made of, for example, a glass-ceramic plate, a silicon single-crystal substrate, or a stainless steel plate having a thickness of 0.01 mm to 1 mm and a coefficient of linear expansion of 2.5 to 4.5 [$\times 10^{-6}$/° C.] at a temperature of 300° C. or lower.

As described above, an elastic film 50 consisting of silicon dioxide having a thickness of, for example, about 1.0 μm is provided on a surface of the channel-forming substrate 10 opposite the open surface. An insulator film 55 consisting of zirconium oxide ($ZrO_2$) or the like, having a thickness of, for example, about 0.4 μm is deposited on the elastic film 50. A lower electrode film 60 having a thickness of about 0.1 μm to 0.5 μm, a piezoelectric layer 70 comprising lead zirconate titanate (PZT) or the like having a thickness of about 1.1 μm, which is a piezoelectric film, and an upper electrode film 80 having a thickness of about 0.05 μm, for example, are deposited on the insulator film 55. The lower electrode film 60, the piezoelectric layer 70, and the upper electrode film 80 are deposited in a step described below and constitute piezoelectric elements 300. Each of the piezoelectric elements 300 includes the lower electrode film 60, the piezoelectric layer 70, and the upper electrode film 80. In general, one of the lower and upper electrode films 60 and 80 of the piezoelectric element 300 serves as a common electrode, and the other electrode film and the piezoelectric layer 70 are patterned to correspond to the pressure-generating chambers 12. Herein, a portion comprising the piezoelectric layer 70 and one of the lower and upper electrode films 60 and 80 which were patterned and in which a piezoelectric strain is caused by application of a voltage to both electrode films 60 and 80, is referred to as a piezoelectric active component. In the piezoelectric element 300 according to the embodiment, the lower electrode film 60 serves as the common electrode and the patterned upper electrode film 80 serves as the individual electrodes. However, the roles of lower and upper electrode films 60 and 80 may be exchanged to facilitate convenience in placing a driving circuit or wiring. Herein, the piezoelectric element 300 and a vibrating plate that is displaced by a driving of the piezoelectric element 300 are together referred to as an actuator device. In the embodiment, the elastic film 50, the insulator film 55, and the lower electrode film 60 serve as the vibrating plate. However, only the lower electrode film 60 may serve as the vibrating plate without the elastic film 50 and the insulator film 55. Alternatively, the piezoelectric element 300 itself may substantially serve as the vibrating plate.

The piezoelectric layer 70 constituting the piezoelectric element 300 comprises, for example, a ferroelectric-piezoelectric material such as lead zirconate titanate (PZT), or a relaxor ferroelectric material which can be obtained by adding metal such as niobium, nickel, magnesium, bismuth, or yttrium to the ferroelectric-piezoelectric.

A lead electrode 90 comprising gold (Au), for example, is provided on the upper electrode film 80 that serves as the individual electrode in the piezoelectric element 300. The lead electrode 90 extends from the vicinity of an end of the corresponding ink supply channel 14. The lead electrode 90 is electrically connected to a driving circuit 120 by a connecting wire 121 through a penetrating-opening 33 described in detail below.

A protective substrate 30 is bonded to the channel-forming substrate 10 having the piezoelectric element 300 provided thereon with an adhesive 35. The protective substrate 30 has a reservoir section 31 in a region corresponding to the communicating region 13. As described above, the reservoir section 31 and the communicating region 13 in the channel-forming substrate 10 communicate with each other and constitute the reservoir 100 that serves as the common liquid chamber of the pressure-generating chambers 12. It is also possible that the communicating region 13 in the channel-forming substrate 10 is divided into compartments corresponding to the pressure-generating chambers 12 to make only the reservoir section 31 serve as the reservoir. It is also possible that, for example, only the pressure-generating chambers 12 are provided in the channel-forming substrate 10 and that the ink supply channels 14 communicating with the reservoir and the pressure-generating chambers 12 are provided in a member interposed between the channel-forming substrate 10 and the protective substrate 30 (for example, the elastic film 50 and the insulator film 55).

The protective substrate 30 has a piezoelectric-element retaining section 32, which has an internal space large enough not to hinder operation of the piezoelectric element 300, provided in a region corresponding to the piezoelectric element 300. The piezoelectric-element retaining section 32 may be either sealed or unsealed, as long as it provides an internal space large enough not to hinder operation of the piezoelectric element 300.

Further, the penetrating-opening 33 extending in the thickness direction of the protective substrate 30 is provided in a region between the piezoelectric-element retaining section 32 and the reservoir section 31. A part of the lower electrode film 60 and tips of the lead electrodes 90 are exposed through the penetrating-opening 33.

Further, the driving circuit 120 that drives the piezoelectric element 300 is mounted on the protective substrate 30. The driving circuit 120 may be, for example, a circuit substrate, a semiconductor integrated circuit (IC), or the like. The driving circuit 120 and the lead electrode 90 are electrically connected by the connecting wire 121 made of a conductive wire such as a bonding wire.

The protective substrate 30 is preferably made of, for example, glass or ceramics having a coefficient of thermal expansion substantially equivalent to that of the channel-forming substrate 10. In the embodiment, the protective substrate 30 is made of the same material as the channel-forming substrate 10, i.e., a silicon single-crystal substrate having a (110) crystal plane orientation.

Further, a compliance substrate 40 including a sealing film 41 and a fixing plate 42 is bonded to the protective substrate 30 with an adhesive 36. The sealing film 41 is made of a flexible material having a low rigidity (for example, a polyphenylene sulfide (PPS) film having a thickness of 6 μm). The sealing film 41 seals the reservoir section 31 from one side. The fixing plate 42 is made of a hard material such as metal (for example, a stainless steel (SUS) plate having a thickness of 30 μm). A region of the fixing plate 42 facing the reservoir 100 is completely removed in the thickness direction to provide an opening 43. The reservoir 100 is sealed solely by the flexible sealing film 41 from one side.

The protective substrate 30 has a groove 37 provided in a region to be bonded to the compliance substrate 40. The groove 37 prevents overflow of the adhesive 36 used for bonding the compliance substrate 40 and the protective substrate 30 together. In the manufacturing step described in detail below, when providing fragile portions in a wafer for forming the protective substrates, any of the adhesive 36 flowed into a region to be irradiated with a laser beam may block the laser beam. Accordingly, the groove 37 needs to be provided in a region of the protective substrate 30 to be bonded to the compliance substrate 40, and more specifically, near boundaries between regions in the wafer for forming the protective substrates, each of the regions becoming one of the protective substrates 30.

In the ink jet recording head according to the embodiment, ink is supplied from an external ink supply unit (not shown) to fill the inside of the ink jet recording head from the reservoir 100 to the nozzle openings 21. The driving circuit 120 sends a recording signal to apply a voltage between the lower electrode film 60 and the upper electrode film 80 of each of the pressure-generating chambers 12. This causes the elastic film 50, the insulator film 55, the lower electrode film 60, and the piezoelectric layer 70 to be deflected and increases the pressure in the pressure-generating chambers 12, thereby causing ink droplets to be ejected from the nozzle openings 21.

Figure 3A:
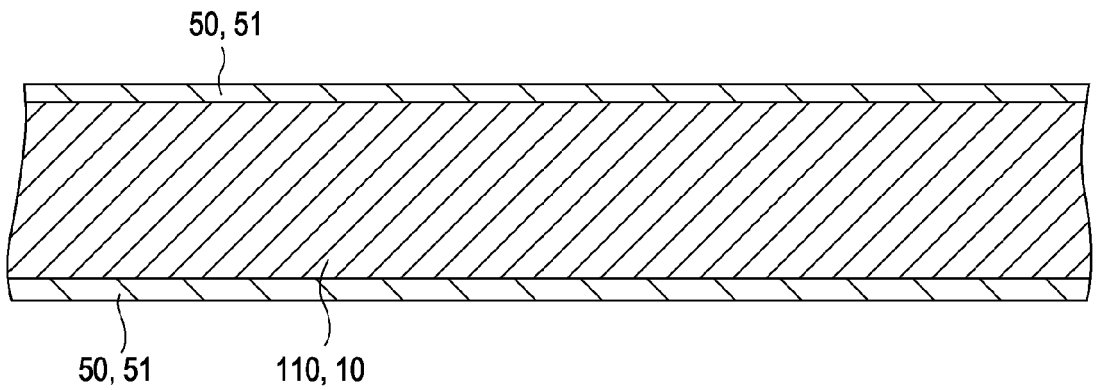
FIG. 3A is a cross-sectional view showing a method for manufacturing ink jet recording heads.

A method for manufacturing ink jet recording heads will now be described with reference to FIGS. 3A to 11. FIGS. 3A to 7B and 11 are cross-sectional views of a structure constituting ink jet recording heads, taken along a longitudinal direction of the pressure-generating chambers. FIG. 8 is a plan view of a wafer 130 for forming protective substrates. FIGS. 9A and 9B are cross-sectional views of the structure constituting ink jet recording heads, taken along a lateral direction of the pressure-generating chambers. As shown in FIG. 3A, a wafer 110 as a silicon wafer in which a plurality of the channel-forming substrates 10 are to be formed integrally is thermally oxidized in a diffusion furnace having a temperature of about 1100° C. so as to form a silicon dioxide film 51 constituting the elastic film 50 thereon. In the embodiment, highly rigid silicon wafer is employed as the wafer 110 for forming channel-forming substrates.

Figure 3B:
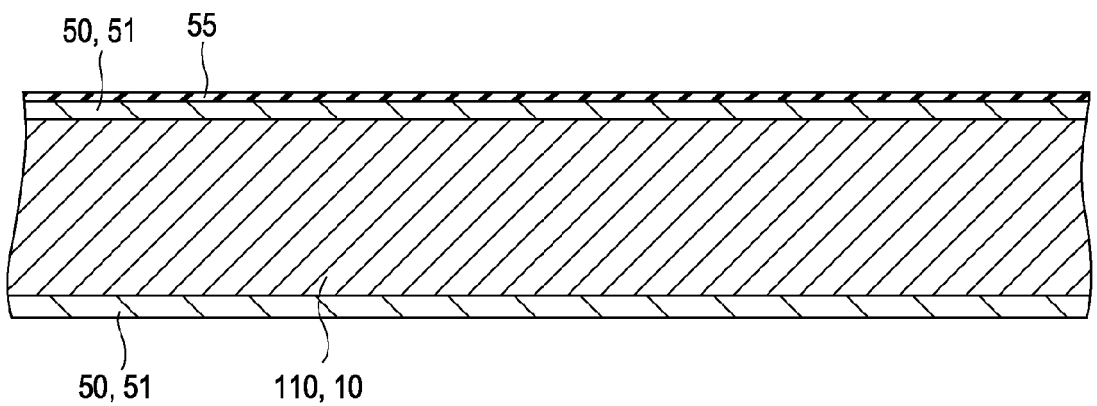
FIG. 3B is a cross-sectional view showing the method for manufacturing ink jet recording heads.

Next, referring to FIG. 3B, the insulator film 55 made of zirconium oxide is formed on the elastic film 50 (silicon dioxide film 51). Specifically, after a zirconium (Zr) layer is formed on the elastic film 50 (silicon dioxide film 51) by, for example, sputtering, the zirconium layer is thermally oxidized in a diffusion furnace whereby the insulator film 55 made of zirconium oxide ($ZrO_2$) is formed.

Figure 3C:
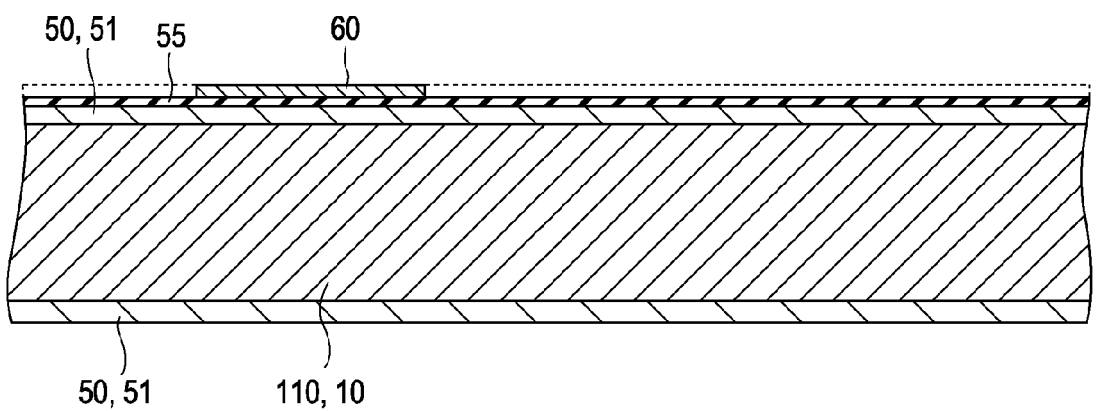
FIG. 3C is a cross-sectional view showing the method for manufacturing ink jet recording heads.

Next, referring to FIG. 3C, the lower electrode film 60 is formed by, for example, depositing platinum (Pt) and iridium (Ir) on the insulator film 55. Then, the lower electrode film 60 is patterned into a predetermined shape. The lower electrode film 60 is not necessarily the deposit of platinum (Pt) and iridium (Ir), but may be an alloy thereof. Further, the lower electrode film 60 may also be a monolayer including one of platinum (Pt) and iridium (Ir), or a layer of a material such as metal or metaloxide other than the above materials.

Figure 4A:
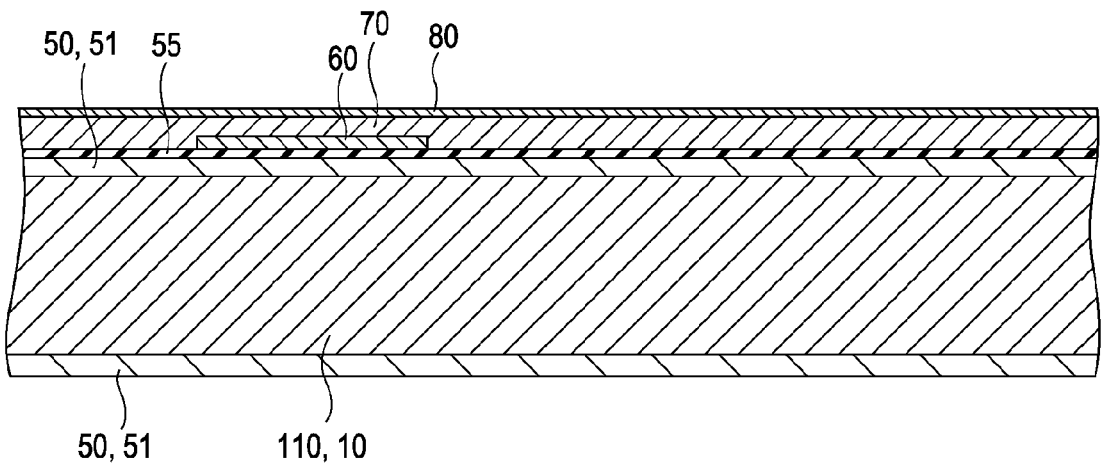
FIG. 4A is a cross-sectional view showing the method for manufacturing ink jet recording heads.
Figure 4B:
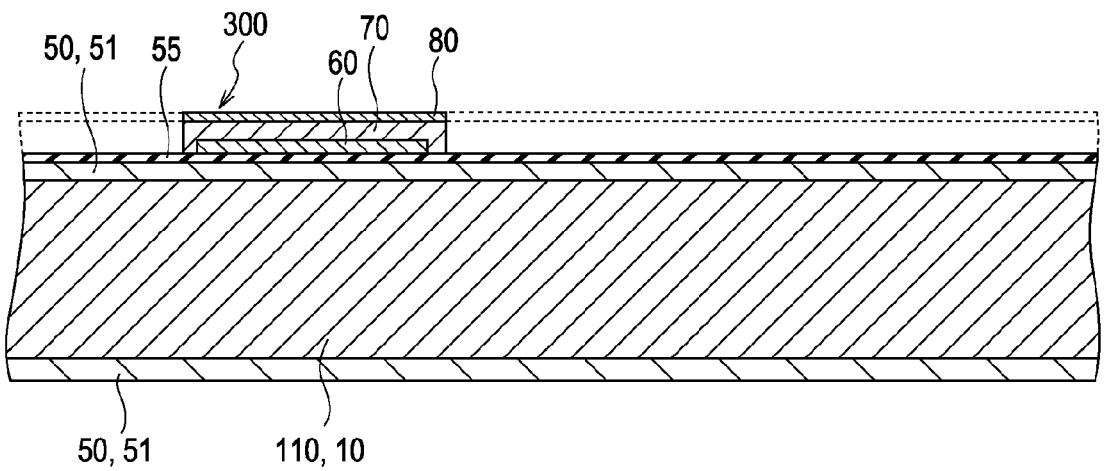
FIG. 4B is a cross-sectional view showing the method for manufacturing ink jet recording heads.

Next, referring to FIG. 4A, the piezoelectric layer 70 made of lead zirconium titanate (PZT), for example, and the upper electrode film 80 made of iridium, for example, are formed over the entire surface of the wafer 110 for forming channel-forming substrates. Then, referring to FIG. 4B, the piezoelectric layer 70 and the upper electrode film 80 are patterned so as to form regions corresponding to the pressure-generating chambers 12, thereby forming the piezoelectric elements 300. Examples of the material used for the piezoelectric layer 70 comprising the piezoelectric elements 300 include a ferroelectric-piezoelectric material such as lead zirconium titanate (PZT), and a relaxor ferroelectric material composed by adding metal such as niobium, nickel, magnesium, bismuth, or yttrium to the ferroelectric-piezoelectric material. In the embodiment, the piezoelectric layer 70 is formed by first applying and drying a so-called sol, in which a metal organic is dissolved and dispersed in a solvent, so as to obtain a gel, and then firing the gel at a high temperature. In this manner, the piezoelectric layer 70 as a metaloxide is obtained. This is what is called the sol-gel method. The method for forming the piezoelectric layer 70 is not particularly limited, but may be the metal organic decomposition (MOD) method or the sputtering method, for example.

Figure 4C:
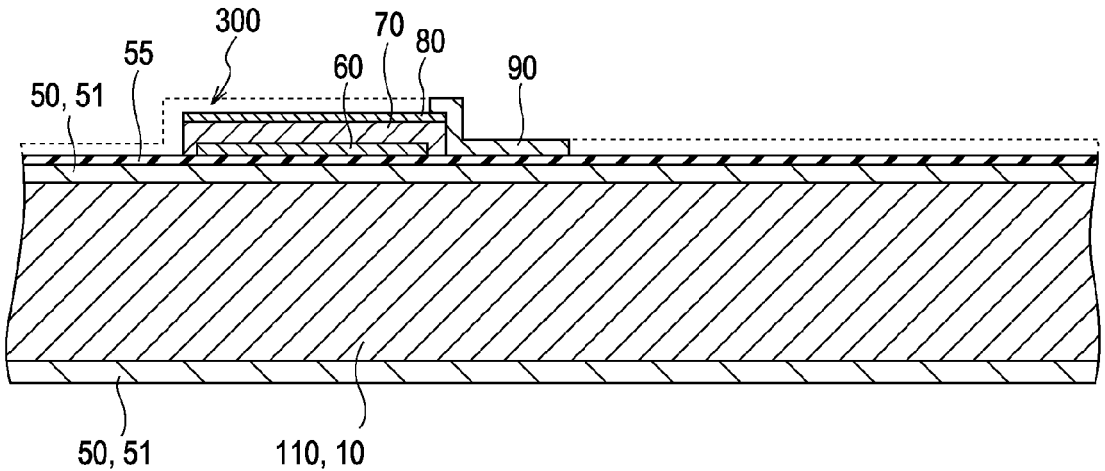
FIG. 4C is a cross-sectional view showing the method for manufacturing ink jet recording heads.

Next, referring to FIG. 4C, the lead electrode 90 made of gold (Au) is formed over the entire surface of the wafer 110, and then the lead electrode 90 is patterned so as to form regions corresponding to the piezoelectric elements 300.

Figure 5A:
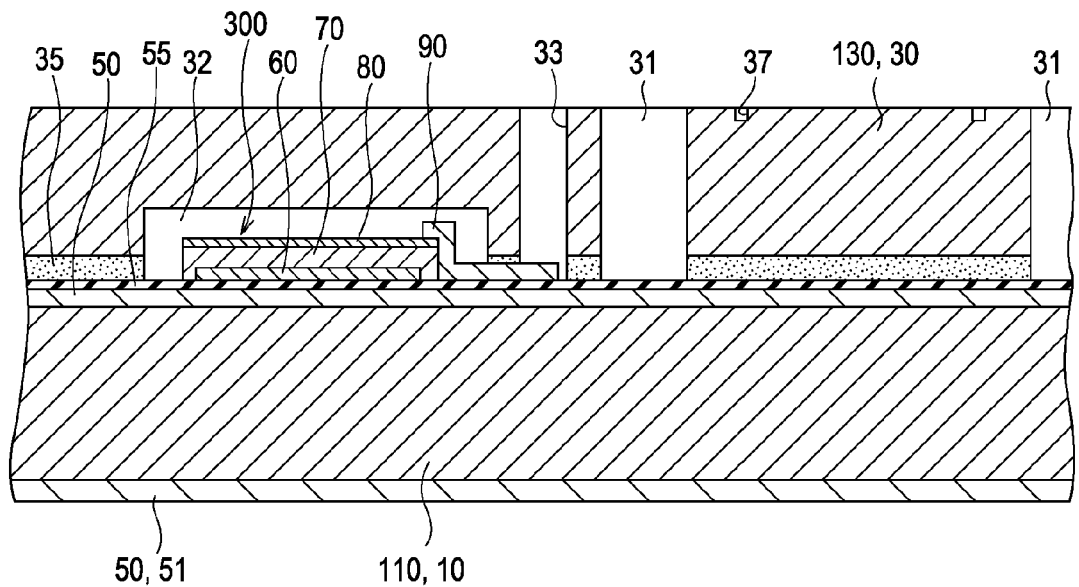
FIG. 5A is a cross-sectional view showing the method for manufacturing ink jet recording heads.

Next, referring to FIG. 5A, a wafer 130 for forming protective substrates is bonded to the wafer 110 for forming channel-forming substrates with the adhesive 35 therebetween in such a manner that respective bonding surfaces of the wafers 130 and 110 face each other. The wafer 130, in which a plurality of the protective substrates 30 are integrally formed, is provided with the reservoir sections 31 and the piezoelectric-element-retaining sections 32 in advance. Since the wafer 130 has a thickness of about 400 μm, for example, the rigidity of the wafer 110 is greatly improved with the wafer 130 being bonded thereonto.

The surface of the wafer 130 not having contact with the wafer 110 is mirror-finished in advance by, for example, polishing such as dry polishing. By mirror-finishing the surface of the wafer 130 not having contact with the wafer 110 in advance, a laser beam, with which the wafer 130 is to be irradiated in a later step described below in detail, is prevented from becoming diffused with foreign matters or slight irregularities on the surface of the wafer 130. Accordingly, processing by using a laser beam can be performed with a high accuracy.

The wafer 130 is also provided with the grooves 37 in advance. The grooves 37 are provided in respective regions where the compliance substrates 40 are to be bonded. The grooves 37 prevent the adhesive 36 used for bonding the compliance substrates 40 from flowing into regions to be irradiated with the laser beam and blocking the laser beam with which the wafer 130 is irradiated in the later step. That is, if the wafer 130 has the grooves 37 within the respective regions where the compliance substrates 40 are to be bonded and near the boundaries between the regions to become the protective substrates 30, the adhesive 36 used for bonding the compliance substrates 40 can be prevented from flowing into the regions to be irradiated with the laser beam.

Figure 5B:
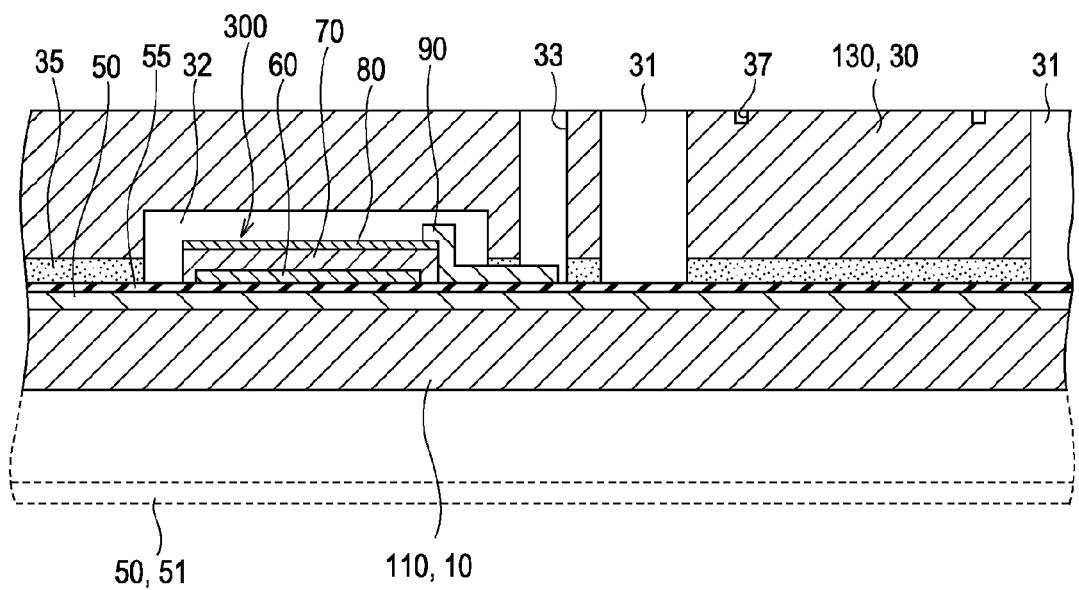
FIG. 5B is a cross-sectional view showing the method for manufacturing ink jet recording heads.

Next, referring to FIG. 5B, the wafer 110 is made thinner to have a predetermined thickness.

Figure 6A:
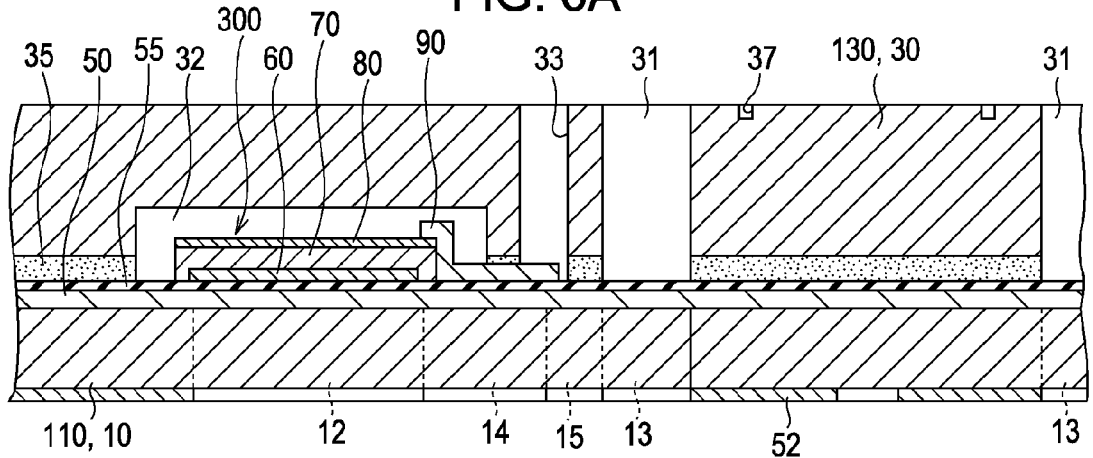
FIG. 6A is a cross-sectional view showing the method for manufacturing ink jet recording heads.
Figure 6B:
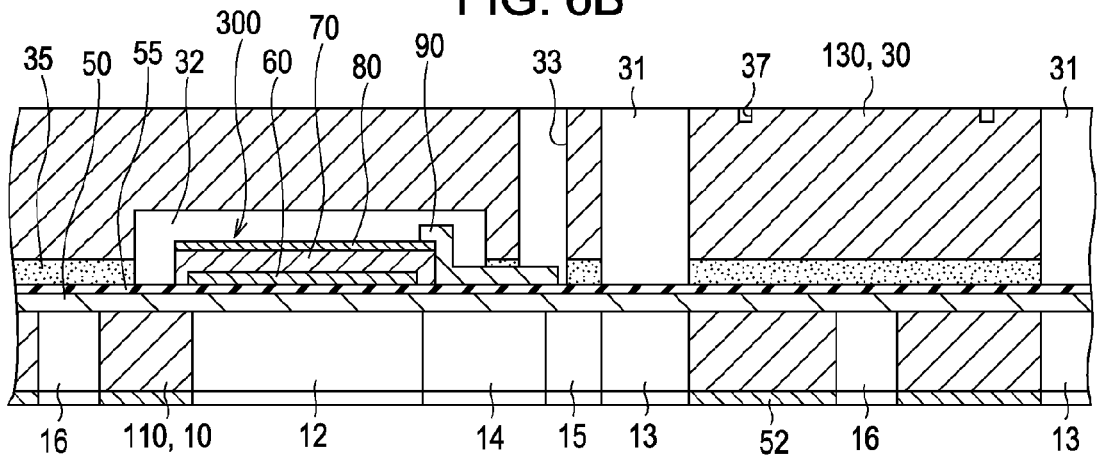
FIG. 6B is a cross-sectional view showing the method for manufacturing ink jet recording heads.

Next, referring to FIG. 6A, a mask film 52 is newly formed on the wafer 110, and the mask film 52 is patterned into a predetermined shape. Then, referring to FIG. 6B, the wafer 110 with the mask film 52 formed thereon is subjected to anisotropic etching (wet etching) using an alkaline solution containing potassium hydroxide (KOH) or the like, whereby the pressure-generating chambers 12 corresponding to the piezoelectric elements 300, the communicating region 13, the ink supply channels 14, the communicating channels 15, and the like are formed for each of regions to become the channel-forming substrates 10.

Further, recesses 16 are formed in the wafer 110 along the boundaries between the regions to become the channel-forming substrates 10. In the embodiment, the recesses 16 are formed simultaneously with the pressure-generating chambers 12 by anisotropically etching the wafer 110 until the elastic film 50 is exposed. That is, in the embodiment, the recesses 16 extending completely through the wafer 110 in the thickness direction of the wafer 110 are formed. The pressure-generating chambers 12 and the recesses 16 are not necessarily formed in such a manner, but may be formed by dry etching such as ion milling, reactive ion etching (RIE), or the like. Further, the recesses 16 and the pressure-generating chambers 12 may be formed separately. Furthermore, the recesses 16 may only partially extend into the wafer 110 in the thickness direction of the wafer 110 so as not to completely extend therethrough. Alternatively, the recesses 16 may extend completely through the wafer 110 and further extend partially into the wafer 130 in the thickness direction of the wafer 130. The depth of the recesses 16 may be determined appropriately in accordance with the condensing point of the laser beam with which the wafer 130 is irradiated in the step described below in detail.

Figure 6C:
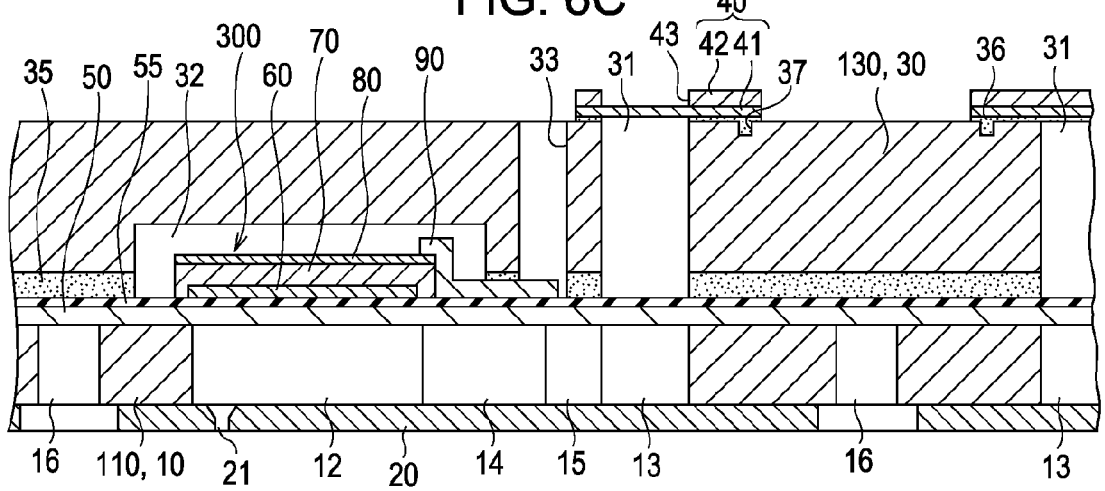
FIG. 6C is a cross-sectional view showing the method for manufacturing ink jet recording heads.

Next, referring to FIG. 6C, the mask film 52 is removed from the wafer 110. Then, the nozzle plates 20 each having nozzle openings 21 are bonded to the respective regions to become the channel-forming substrates 10 in the wafer 110. Further, the compliance substrates 40 are bonded to the respective regions to become the protective substrates 30 in the wafer 130 with the adhesive 36 provided therebetween.

In the above state, since the wafer 130 already has the grooves 37 in the regions where the compliance substrates 40 are to be bonded, the adhesive 36 used when bonding the compliance substrates 40 stays within the grooves 37. Therefore, the adhesive 36 can be prevented from flowing outside each of the compliance substrates 40, particularly, toward each of the boundaries between the regions to become the protective substrates 30. In this manner, when the wafer 130 is irradiated with a laser beam along each of the boundaries between the regions to become the protective substrates 30 in the later step, the laser beam can be prevented from being blocked by any of the adhesive 36 flowed toward the boundaries.

Figure 7A:
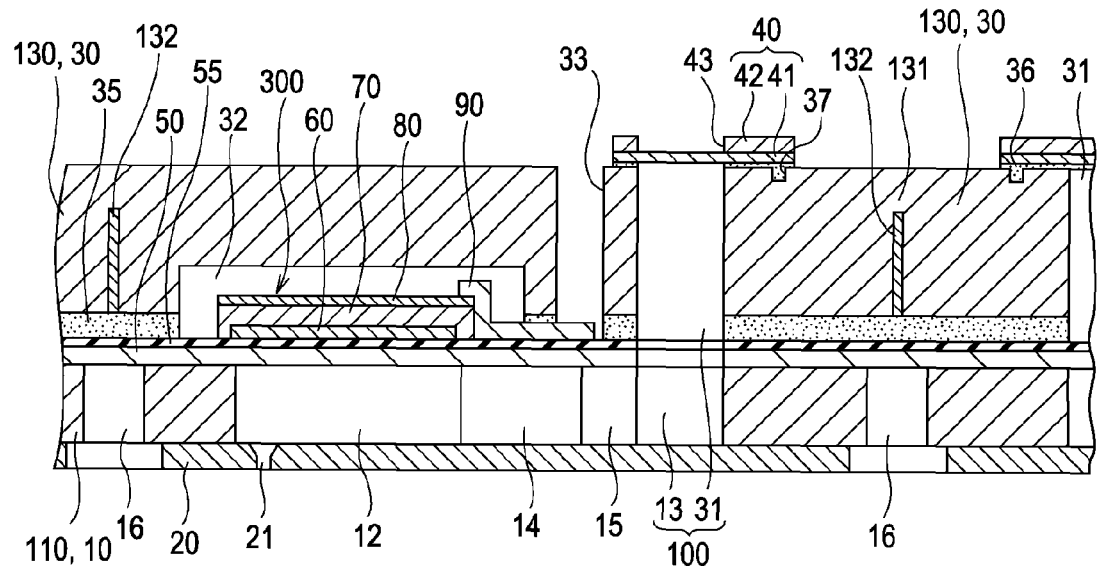
FIG. 7A is a cross-sectional view showing the method for manufacturing ink jet recording heads.
Figure 7B:
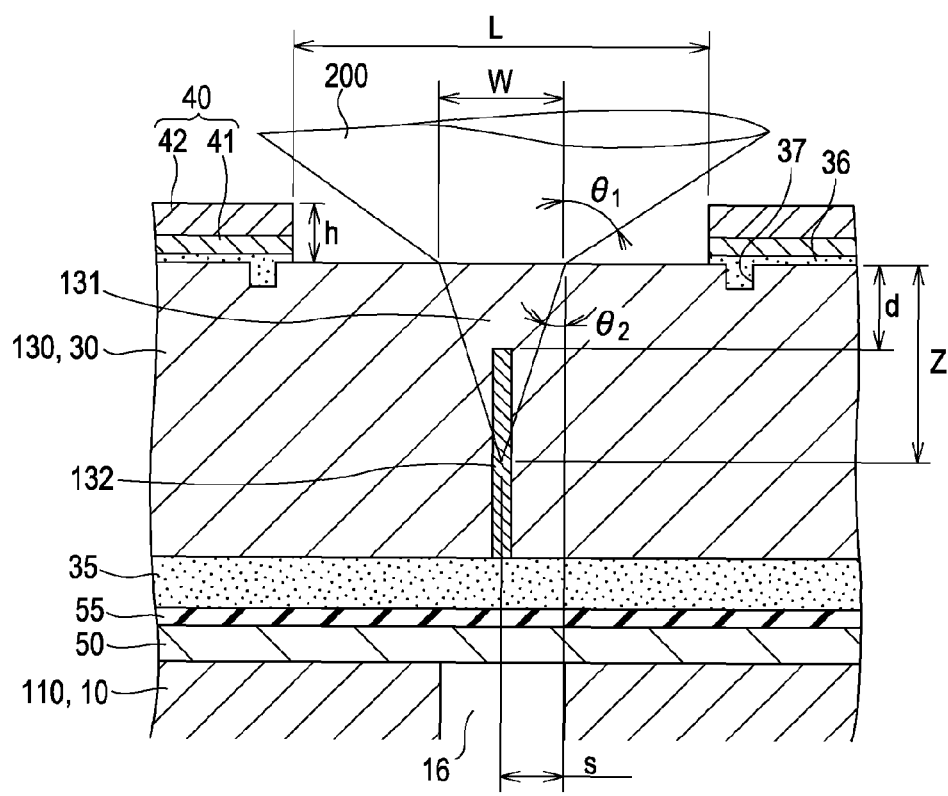
FIG. 7B is a cross-sectional view showing the method for manufacturing ink jet recording heads.
Figure 8:
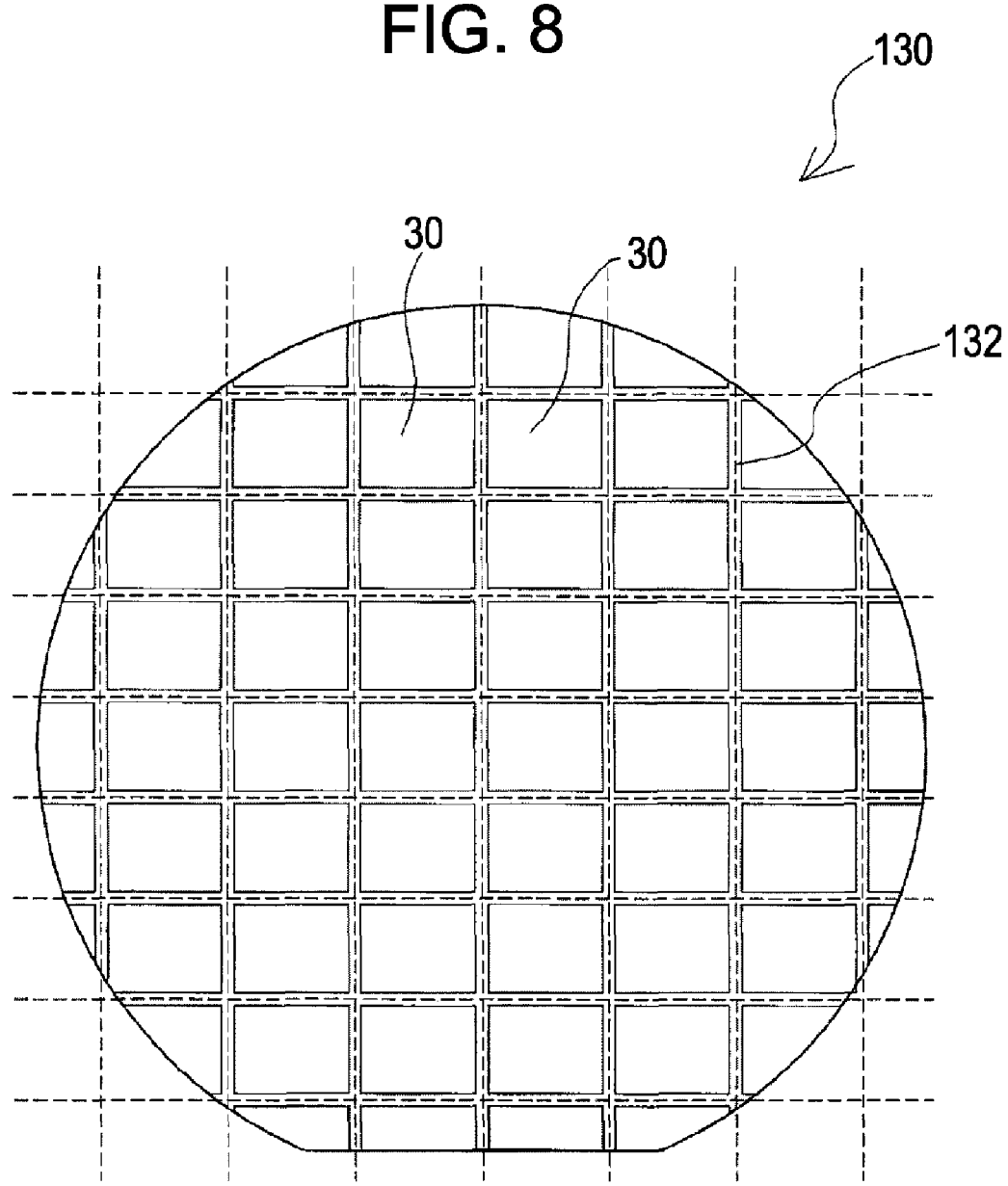
FIG. 8 is a plan view of a wafer for forming protective substrates.
Figure 9A:
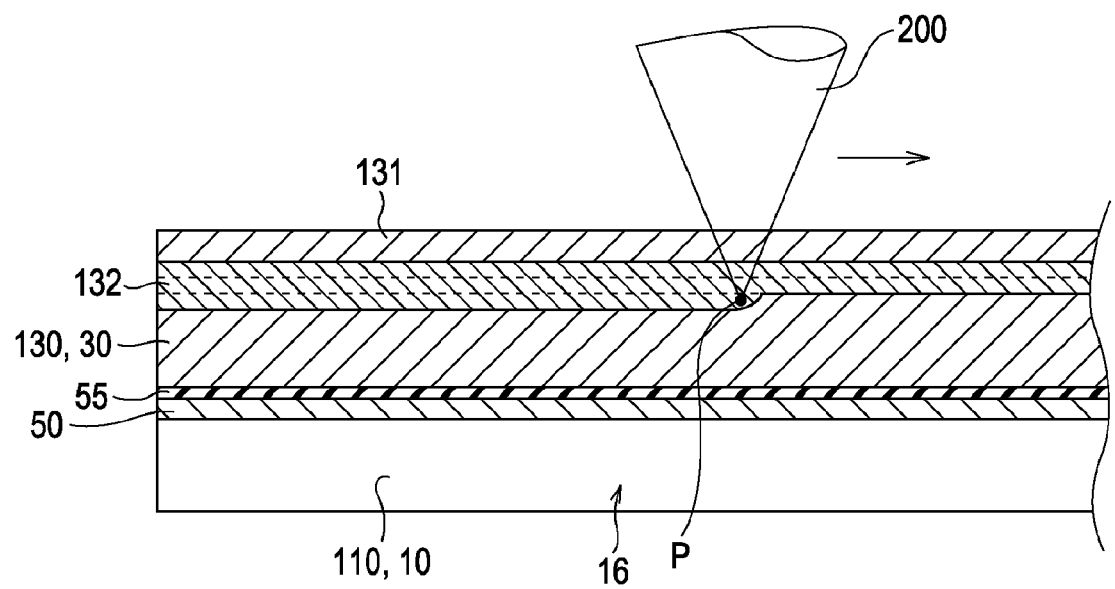
FIG. 9 is a cross-sectional view showing the method for manufacturing ink jet recording heads.
Figure 9B:
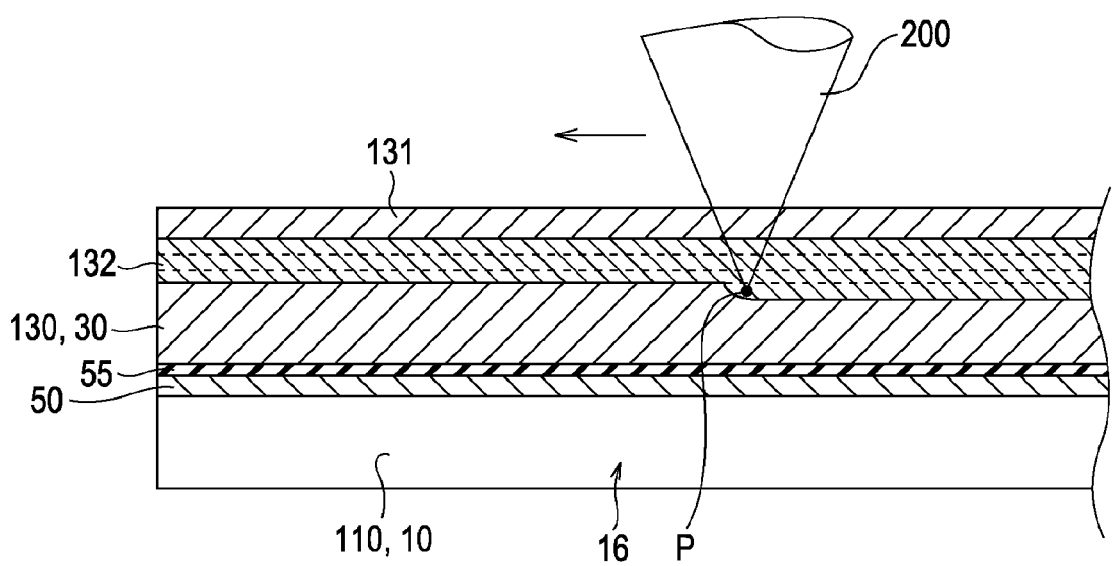

Next, referring to FIG. 7A, the surface of the wafer 130 not having contact with the wafer 110 is irradiated with a laser beam 200 of, for example, a YAG laser, such that the condensing point of the laser beam 200 is aligned with each of the boundaries (planned dividing lines), indicated by dotted lines in FIG. 8, between the regions to become the protective substrates 30 in the wafer 130. Thus, as shown in FIG. 7B, fragile portions 132 are formed with a predetermined width in the wafer 130, while connected portions 131 are left at the irradiated surface of the wafer 130. The connected portions 131 may be formed only at the irradiated surface of the wafer 130 or both at the irradiated surface and the bonding surface of the wafer 130. In either case, the fragile portions 132 needs to be formed in the wafer 130.

Specifically, the fragile portions 132 are formed by irradiating the wafer 130 with the laser beam 200 under predetermined conditions such that the laser beam 200 is condensed at a point inside the wafer 130 so as to cause multiphoton absorption inside the wafer 130. The fragile portions 132 formed in such a manner are provided in regions facing the recesses 16 provided in the wafer 110.

Each of the fragile portions 132 is a region in the wafer 130 at which characteristics of the wafer 130 are changed by the irradiation with the laser beam 200, i.e., a cracked region including a plurality of small cracks, a fused region that is in a fused state or in a resolidified state after being fused, or the like. The regions of the wafer 130 to become the protective substrates 30 are substantially isolated from each other at the fragile portions 132. In other words, the regions of the wafer 130 to become the protective substrates 30 are substantially connected to each other only at the connected portions 131. If part of the fragile portions 132 collapses during the formation thereof, there is no problem.

The location of each of the fragile portions 132 formed by applying the laser beam 200 varies with conditions including the power, scanning speed, and the like of the laser beam 200, but needs to be set to near the condensing point. Therefore, as shown in FIGS. 9A and 9B, each of the fragile portions 132 is formed by scanning the laser beam 200 a plurality of times along the same region on the planned dividing line at a predetermined speed while the condensing point P is changed in the thickness direction of the wafer 130. In the embodiment, scanning with the laser beam 200 in forming the fragile portions 132 is performed ten times at a speed of 300 mm/s, for example, which varies with the thickness of the wafer 130.

In the embodiment of the invention, the fragile portions 132 with a predetermined width are formed in the wafer 130 along the planned dividing lines on the wafer 130, while the connected portions 131 are left at the surface of the wafer 130 irradiated with the laser beam 200. In other words, the fragile portions 132 are formed by irradiating the wafer 130 with the laser beam 200 such that the laser beam 200 is condensed inside the wafer 130. It is also possible to form the fragile portions 132 by irradiating the wafer 110 with the laser beam 200 from the surface in which the pressure-generating chambers 12 open. However, as to be described in detail below, since the aforementioned surface of the wafer 110 also has the recesses 16 provided therein and the nozzle plates 20 bonded thereto, the condensing point of the laser beam 200 cannot reach the surface of the wafer 130 not having contact with the wafer 110 unless the distance between adjacent nozzle plates 20 is increased so that the nozzle plates 20 do not block the laser beam 200. This reduces the number of obtainable chips from a single wafer. Moreover, if the laser beam 200 is applied through the wafer 110 toward the wafer 130, the laser beam 200 is diffused because of the rough surface of the wafer 110 subjected to anisotropic etching for forming, for example, the pressure-generating chambers 12 and the recesses 16. Therefore, laser processing becomes impossible. In contrast, if the connected portions 131 and the fragile portions 132 are formed at predetermined positions in the thickness direction of the wafer 130 by the former irradiation method, the wafers 110 and 130 can be relatively easily and preferably divided in a later step described below. Additionally, when the wafers 110 and 130 are divided, particles including cracked pieces are negligibly scattered around and almost no foreign matter (particles) adheres to the wafers 110 and 130. Further, the in-advance mirror-finishing of the surface of the wafer 130 that is to be irradiated with the laser beam 200 prevents the laser beam 200 from becoming diffused at the surface of the wafer 130. This prevents irregular formation of the fragile portions 132. Consequently, occurrence of failures when the wafer 130 is divided into chips can be prevented.

Referring to FIG. 7B, it is preferable that a thickness d of the connected portions 131 left when the fragile portions 132 are formed be as small as possible. That is, it is preferable that the thickness d of the connected portions 131 be made as small as possible such that the regions to become the protective substrates 30 in the wafer 130 are not isolated from each other during the head manufacturing process. Specifically, the thickness d of the connected portions 131 is preferably 30 µm or smaller. The fragile portions 132, which are formed by irradiating the wafer 130 with the laser beam 200, have a relatively small width. It is preferable that the width of the fragile portions 132 be as small as possible. Specifically, the width of the fragile portions 132 is preferably 15 µm or smaller.

By forming the fragile portions 132 and the connected portions 131 with such dimensions, the wafers 110 and 130 can be preferably divided into chips in the later step described below.

Figure 10A:
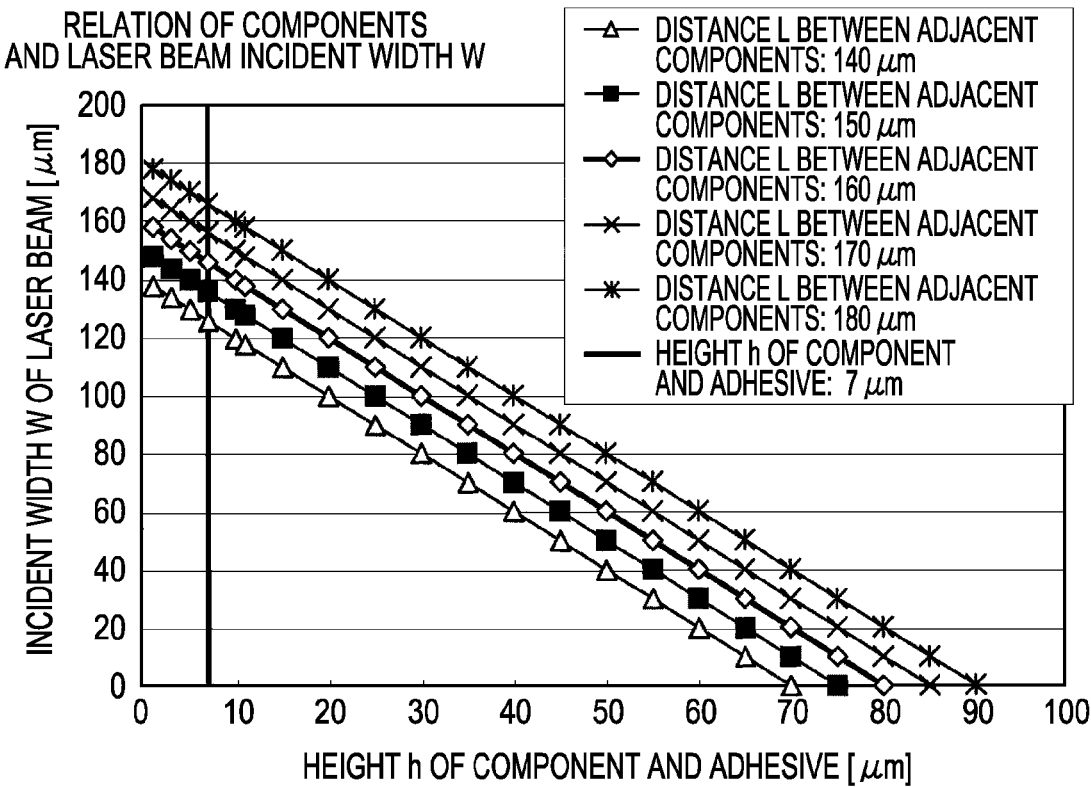
FIG. 10A is a chart showing the relationship between the arrangement of components and a laser beam.
Figure 10B:
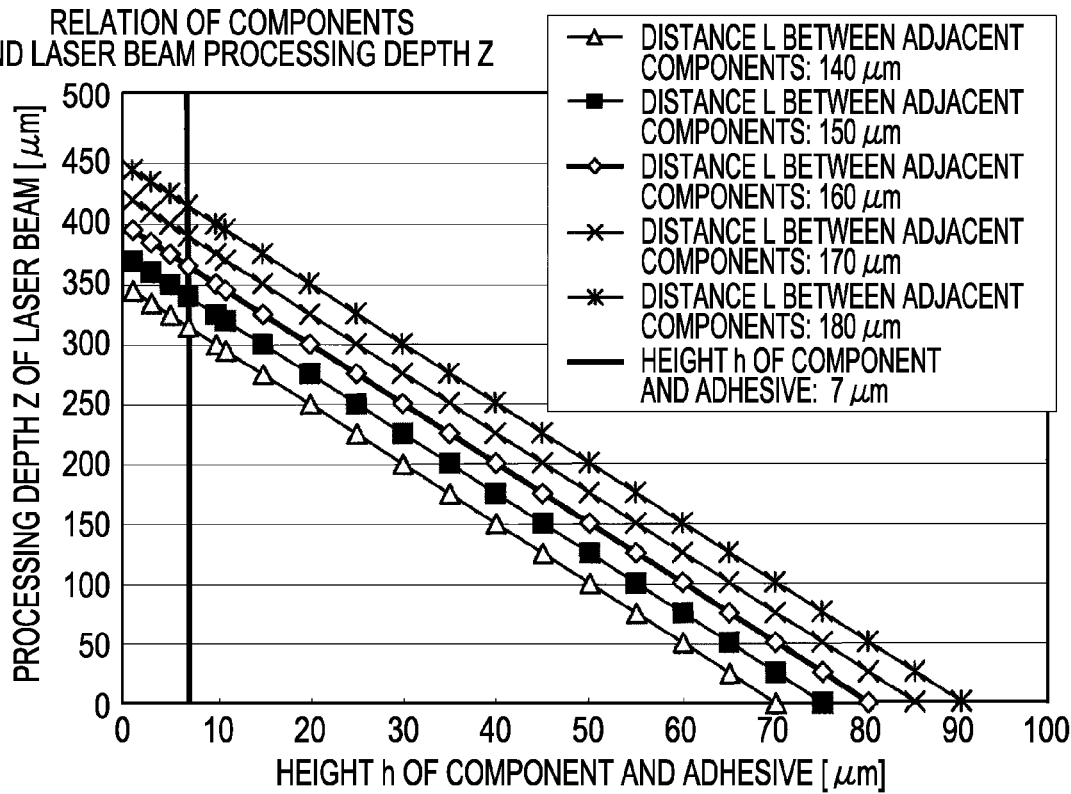
FIG. 10B is a chart showing the relationship between the arrangement of components and a laser beam.

Now, the relationship between the arrangement of the compliance substrates 40 and the processing depth (the depth of the condensing point) of the laser beam 200 will be described. Each of the compliance substrates 40, which are referred to as components in FIGS. 10A and 10B, is bonded onto a pair of the stacked wafers 110 and 130, as the substrate according to the embodiment, with the adhesive 36 provided therebetween. FIG. 7B is an enlarged cross-sectional view of a relevant part of the wafers 110 and 130 for illustrating dimensions. FIG. 10A is a chart showing the relationship between the arrangement of the components and the incident width of the laser beam. FIG. 10B is a chart showing the relationship between the arrangement of the components and the processing depth of the laser beam.

FIG. 7B shows a height h of the compliance substrate 40 including that of the adhesive 36, a distance L between adjacent compliance substrates 40, an incident width W of the laser beam 200 at the surface of the wafer 130, an incident angle $\theta_1$ of the laser beam 200 striking the wafer 130, an incident angle $\theta_2$ of the laser beam 200 propagating through the wafer 130, a processing depth Z of the laser beam 200, and a distance s from the incident point of the laser beam 200 on the wafer 130 to the condensing point.

When the incident angles $\theta_1$ and $\theta_2$ of the laser beam 200 are 45 degrees and 11 degrees, respectively, the incident width W of the laser beam 200 changes as shown in FIG. 10A. FIG. 10A shows the results of a calculation based on the height h of the compliance substrate 40 and the distance L between adjacent compliance substrates 40. It is understood that the incident width W of the laser beam 200 changes in accordance with the distance L between adjacent compliance substrates 40 and the height h of the compliance substrate 40 because the incident width W of the laser beam 200 needs to be changed so that the laser beam 200 is not blocked by each compliance substrate 40.

FIG. 10B shows the processing depth Z of the laser beam 200 calculated from the possible incident width W of the laser beam 200 calculated from the height h of the compliance substrate 40 and the distance L between adjacent compliance substrates 40. It is understood that the processing depth Z of the laser beam 200 changes in accordance with the incident width W of the laser beam 200. Referring to the results shown in FIG. 10B, when the height h of the compliance substrate 40 is 40 µm and the distance L between adjacent compliance substrates 40 is 140 µm, the processing depth Z of the laser beam 200 is about 150 µm. When the distance L between adjacent compliance substrates 40 becomes 180 µm, the processing depth Z of the laser beam 200 becomes about 250 µm. That is, when the distance L between adjacent compliance substrates 40 is reduced by 40 µm, the processing depth Z of the laser beam 200 is reduced by about 100 µm.

According to FIG. 7B, the relationship between the incident width W and the processing depth Z of the laser beam 200 is represented by the following expression.

$$W = 2 \times \tan 11° \times Z \approx 0.4 Z \tag{1}$$

Therefore, if the processing depth Z of the laser beam 200, the incident width W of the laser beam 200, or the distance L between adjacent compliance substrates 40 is determined, the other dimensions can also be determined in accordance with Expression (1).

Figure 11:
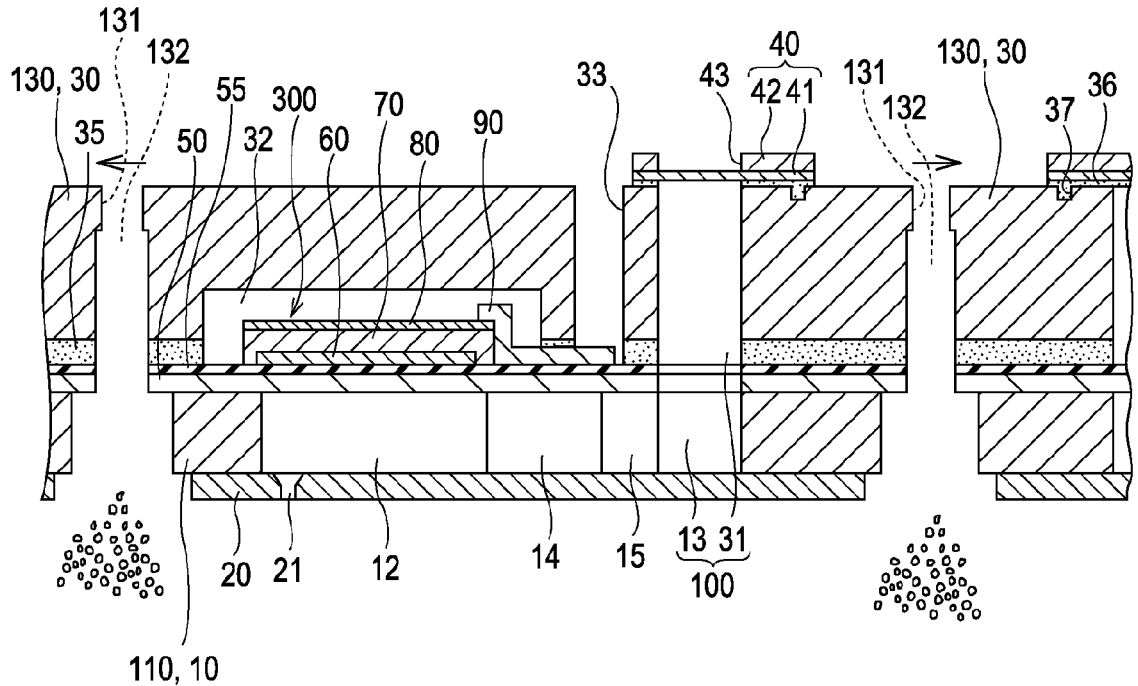
FIG. 11 is a cross-sectional view showing the method for manufacturing ink jet recording heads.

Lastly, an external force is applied to the wafers 110 and 130 to divide the wafers 110 and 130 into pieces each including the channel-forming substrate 10 and the protective substrate 30. The method for applying an external force to the wafers 110 and 130 is not particularly limited. For example, an external force may be applied to the wafers 110 and 130 by using an expanding ring or the like. Thus, as shown in FIG. 11, the wafers 110 and 130 are divided along the fragile portions 132, that is, the connected portions 131 are cut, whereby pieces each including the channel-forming substrate 10 and the protective substrate 30 are provided.

As described above, by mirror-finishing one surface (the surface opposite the bonding surface) of the wafer 130 for forming protective substrates and processing the surface with the laser beam 200, diffused reflection of the laser beam 200 on the surface can be prevented and a highly accurate laser processing can be performed. Further, by forming the recesses 16 in the wafer 110 for forming channel-forming substrates and processing the regions of the wafer 130 for forming protective substrates above the recesses 16 with the laser beam 200, the processing depth Z of the laser beam 200 can be reduced and the distance L between adjacent compliance substrates 40, the components, can also be reduced. Accordingly, the number of ink jet recording heads obtainable by dividing a single pair of the wafers 110 and 130 can be increased and the manufacturing cost can be reduced. In other words, in order to form the fragile portions 132 extending within the thickness of the wafers 110 and 130 by using the laser beam 200 without forming the recesses 16 in the wafer 110, the distance L between adjacent compliance substrates 40 needs to be increased. This reduces the number of ink jet recording heads obtainable from a single pair of the wafers 110 and 130.

If the recesses 16 are formed by anisotropically etching the wafer 110 and the processing depth Z of the laser beam 200 is reduced, time-consuming laser processing can be finished in a shorter time. This shortens the manufacturing time. Consequently, the manufacturing cost can be reduced.

Further, by reducing the processing depth Z of the laser beam 200, irregularities in the formation of each line of the fragile portion 132 can be suppressed. Accordingly, processing can be stabilized. In other words, if the processing depth Z of the laser beam 200 is large, the lines of the fragile portions 132 may become disordered and processing cannot be stabilized.

In the embodiment, the wafer 130 is provided with the grooves 37 within the respective regions where the compliance substrates 40 are bonded so that the adhesive 36 used when bonding the compliance substrates 40 stays within the grooves 37. Therefore, the adhesive 36 can be prevented from flowing toward the boundaries between the regions to become the protective substrates 30. In this manner, when the wafer 130 is irradiated with the laser beam 200 along the boundaries between the regions to become the protective substrates 30, the laser beam 200 can be prevented from being blocked by any of the adhesive 36 that has flowed toward the boundaries. Further, since provision of the grooves 37 prevents the adhesive 36 from blocking the laser beam 200, the intervals at which the compliance substrates 40 are bonded, i.e., the distance L between adjacent compliance substrates 40 does not need to be increased. This also increases the number of ink jet recording heads obtainable from a single pair of the wafers 110 and 130.

Figure 12:
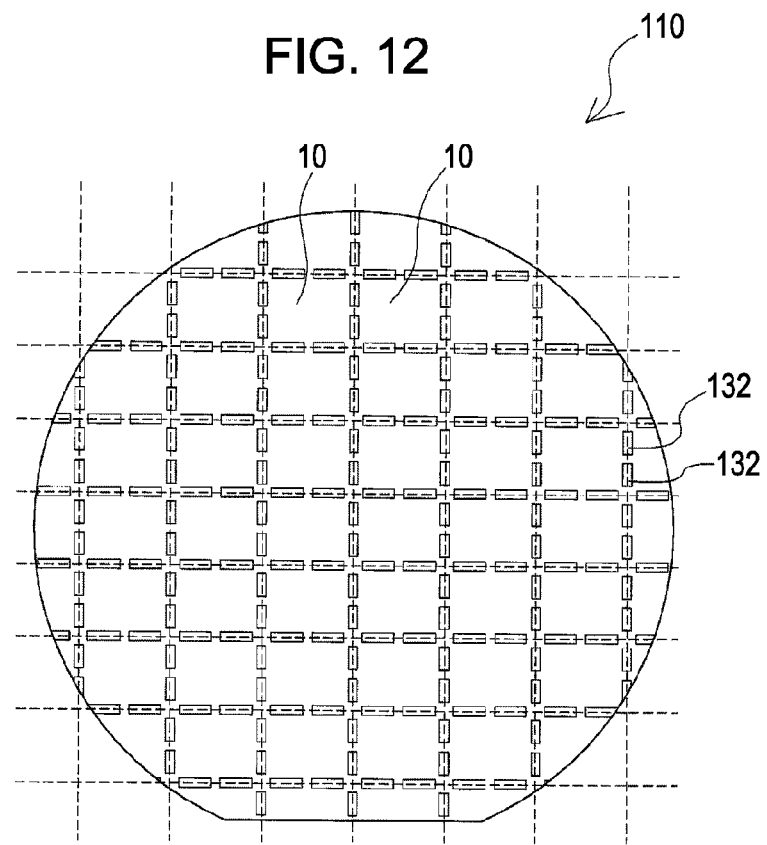
FIG. 12 is a plan view of a wafer for forming protective substrates that employs another exemplary case of fragile portions.

In the embodiment, after the pressure-generating chambers 12 and the recesses 16 are formed in the wafer 110 by etching, the fragile portions 132 are formed by irradiating the wafer 130 with the laser beam 200. However, the method is not limited thereto. The fragile portions 132 may also be formed in the wafer 130 before the pressure-generating chambers 12 and the recesses 16 are formed in the wafer 110, of course. Further, in the embodiment, the fragile portions 132 are formed in continuous lines along the planned dividing lines on the wafer 130. However, as shown in FIG. 12, the fragile portions 132 may also be formed in intermittent lines (dotted lines) along the planned dividing lines.

MODIFICATIONS

While the above description concerns the embodiment of the invention, the invention is not limited thereto, of course. For example, the embodiment has been described by taking a plurality of ink jet recording heads, i.e., liquid ejecting heads, as an example. However, other than the method for manufacturing liquid ejecting heads, the invention can also be applied to a method for manufacturing silicon devices in which a silicon wafer is used. That is, in the embodiment, a structure including the wafer 110 for forming channel-forming substrates and the wafer 130 for forming protective substrates that are bonded together is substituted by a silicon substrate used for manufacturing silicon devices. Further, it is particularly preferable that the invention be applied to a method for dividing a substrate that is relatively easily divided, such as a glass substrate, a magnesium-oxide (MgO) substrate, or the like, as well as a silicon wafer. The type of a laser beam applied for forming fragile portions in a substrate needs to be selected appropriately in accordance with the material of the substrate.

Figure 13A:
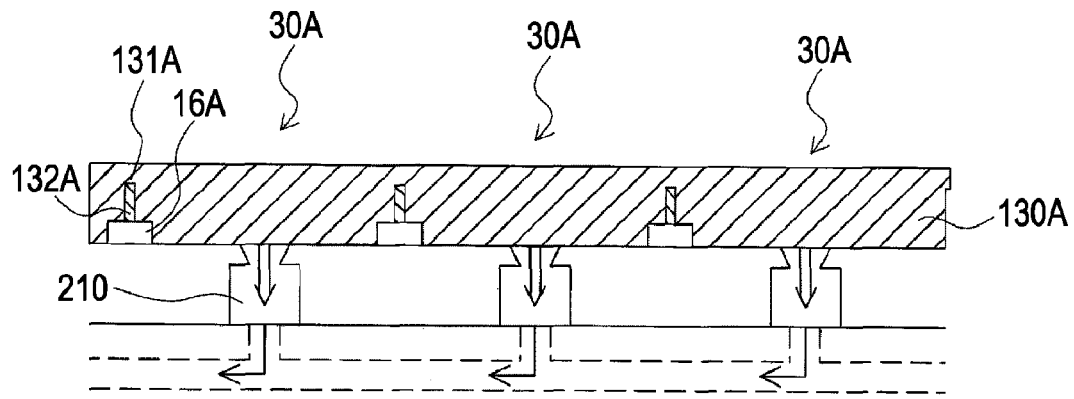
FIG. 13A is a schematic diagram showing another example of a method for dividing a substrate.
Figure 13B:
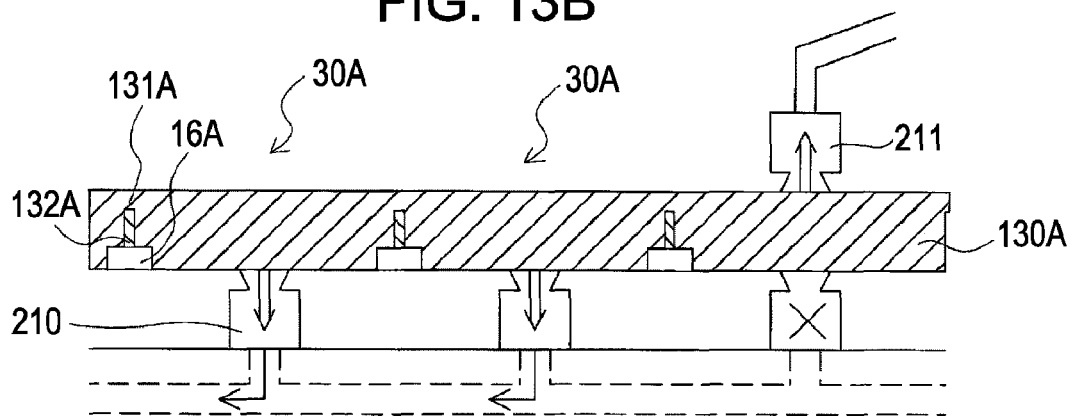
FIG. 13B is a schematic diagram showing the example of the method for dividing a substrate.
Figure 13C:
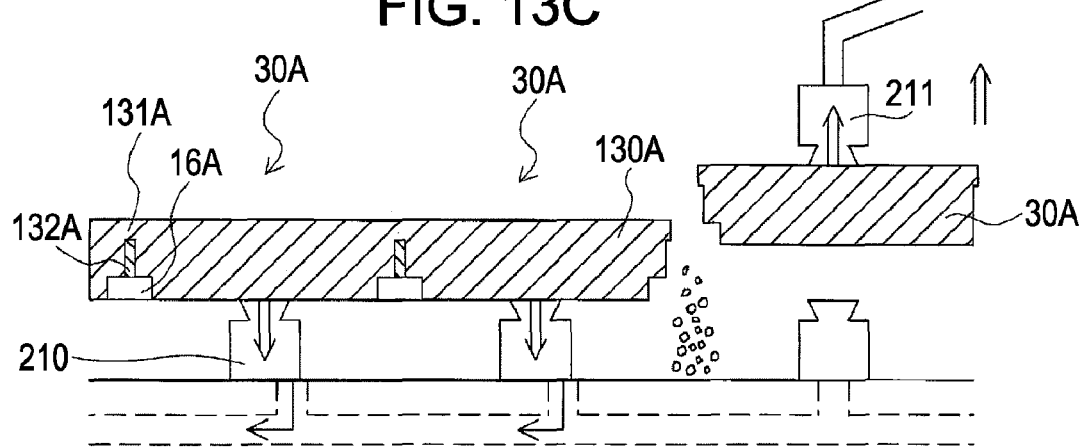
FIG. 13C is a schematic diagram showing the example of the method for dividing a substrate.

Since the fragile portion 132 is provided in a substrate in the embodiment of the invention, the substrate can assuredly be divided into chips even if the external force applied to the substrate is relatively small. Therefore, if, for example, suction can be applied to a substrate to be divided, the substrate can preferably be divided into chips by applying suction to one of chips that are connected to each other with connected portions therebetween and moving the chip. A specific example is shown in FIGS. 13A to 13C. Referring to FIG. 13A, a substrate 130A is sectioned into regions 30A with connected portions 131A and fragile portions 132A therebetween. Suction is applied to each of the regions 30A from one surface of the substrate 130A by a sucker/retainer 210 connected to a vacuum pump or the like. Next, referring to FIG. 13B, suction is applied to one of the regions 30A from the other surface of the substrate 130A by a sucker/mover 211 while the suction by the sucker/retainer 210 applied to the region 30A being subjected to the suction by the sucker/mover 211 is stopped. Then, referring to FIG. 13C, the sucker/mover 211 is moved upward. With an external force applied to the substrate 130A in this step, the substrate 130A can be divided at the connected portions 131A and the fragile portions 132A.

What is claimed is:

1. A method for dividing a wafer into a plurality of chips, the method comprising:
bonding a first substrate having reservoir sections and piezoelectric retaining sections formed therein to a second substrate;
providing recesses and channels in the second substrate simultaneously in an etching process, the recesses being formed at positions along boundaries between regions to become individual chips and the channels being formed inside the regions to become individual chips, such that the recesses and channels extend through an entire width of the second substrate;

providing fragile portions having a predetermined width inside the first substrate at positions along the boundaries by irradiation of a non-bonded surface of the first substrate opposite to the surface bonded to the second substrate with a laser beam whose condensing point is placed inside the first substrate, the fragile portions including a connected portion at the non-bonded surface of the first substrate; and dividing the bonded first and second substrates at the fragile portions into the individual chips by applying an external force to the bonded first and second substrates.

2. The method according to claim 1, wherein the non-bonded surface of the first substrate is mirror-finished before being irradiated with the laser beam.

3. The method according to claim 1, wherein the fragile portions are provided so that a thickness of the connected portions is 30 μm or smaller.

4. The method according to claim 1, wherein a width of the fragile portions is 15 μm or smaller.

5. The method according to claim 1, wherein the fragile portions are provided by scanning the laser beam a plurality of times along the boundaries, the condensing point of the laser beam being differentiated in a thickness direction of the first substrate.

6. A method for manufacturing silicon devices, wherein a silicon wafer is formed as the bonded first and second substrates are divided into a plurality of silicon devices using the method for dividing a wafer according to claim 1.

7. The method according to claim 6, wherein components are formed on a surface of the first substrate before being irradiated with the laser beam thereon.

8. The method according to claim 7, wherein a groove is provided near boundaries between regions to become individual silicon devices in the surface of the first substrate to be bonded to the components before the components are bonded to the non-bonded surface of the first substrate with an adhesive.

9. A method for manufacturing liquid ejecting heads, the method comprising:

bonding a bonding surface of a wafer for forming channel-forming substrates and a bonding surface of a wafer for forming protective substrates, the wafer for forming channel-forming substrates having a plurality of channel-forming substrates integrally formed therein, each of the channel-forming substrates having pressure-generating chambers communicating with nozzle openings that eject liquid and pressure generators that generate pressure in the pressure-generating chambers, the wafer for forming protective substrates having a plurality of protective substrates integrally formed therein corresponding to the channel-forming substrates;

providing recesses and channels in only a bottom surface of the wafer for forming channel-forming substrates opposite the bonding surface thereof simultaneously in an etching process, the recesses being formed at positions along boundaries between regions to become individual channel-forming substrates;

providing fragile portions having a predetermined width inside the wafer for forming protective substrates by irradiation with a laser beam from a surface opposite the bonding surface thereof, a condensing point of the laser beam being placed inside the wafer for forming protective substrates at positions along the boundaries, the fragile portions including a connected portion on the surface opposite the bonding surface where no recesses are formed; and dividing the wafer for forming channel forming substrates and the wafer for forming protective substrates at the fragile portions into a plurality of liquid ejecting heads by applying an external force to the wafer.

* * * * *